United States Patent [19]

Ono et al.

[11] 4,131,267

[45] Dec. 26, 1978

[54] APPARATUS FOR HOLDING WORKPIECE BY SUCTION

[75] Inventors: Takatoshi Ono; Michio Ikeda, both of Tokyo, Japan

[73] Assignee: Disco Kabushiki Kaisha, Tokyo, Japan

[21] Appl. No.: 911,902

[22] Filed: Jun. 2, 1978

[51] Int. Cl.² .............................................. B25B 11/00
[52] U.S. Cl. ..................................................... 269/21
[58] Field of Search ................. 269/21; 51/235; 279/3

[56] References Cited

U.S. PATENT DOCUMENTS

| | | | |
|---|---|---|---|
| 1,945,481 | 1/1934 | Dilkes | 279/3 |
| 3,627,338 | 12/1971 | Thompson | 51/235 |
| 3,724,835 | 4/1973 | Groth | 269/21 |

FOREIGN PATENT DOCUMENTS 2205303  8/1972  Fed. Rep. of Germany ............. 279/3

Primary Examiner—Robert C. Watson

[57] ABSTRACT

Suction apparatus for holding workpieces such as semiconductor substrates or wafers having different diameters comprises a table having an upper surface with a plurality of concentric circular air grooves having different diameters and a plurality of sleeves in radial arcuately spaced bores, respectively, for selectively switching a vacuum source to all or less than all of the grooves. In a preferred embodiment, each sleeve is rotatable about its axis and has a plurality of axially spaced holes which communicate with the vacuum source through the central axial passage in the sleeve. Correspondingly axially spaced holes in the table connect the respective grooves with the bore and are registerable with the sleeve holes through selective rotation of the sleeve to connect the vacuum source and the grooves. The respective sleeves control different numbers of grooves as each is rotated between operating and non-operating positions so as to hold wafers of correspondingly different diameters to the table without necessitating costly and time consuming replacement of major structural components.

8 Claims, 7 Drawing Figures

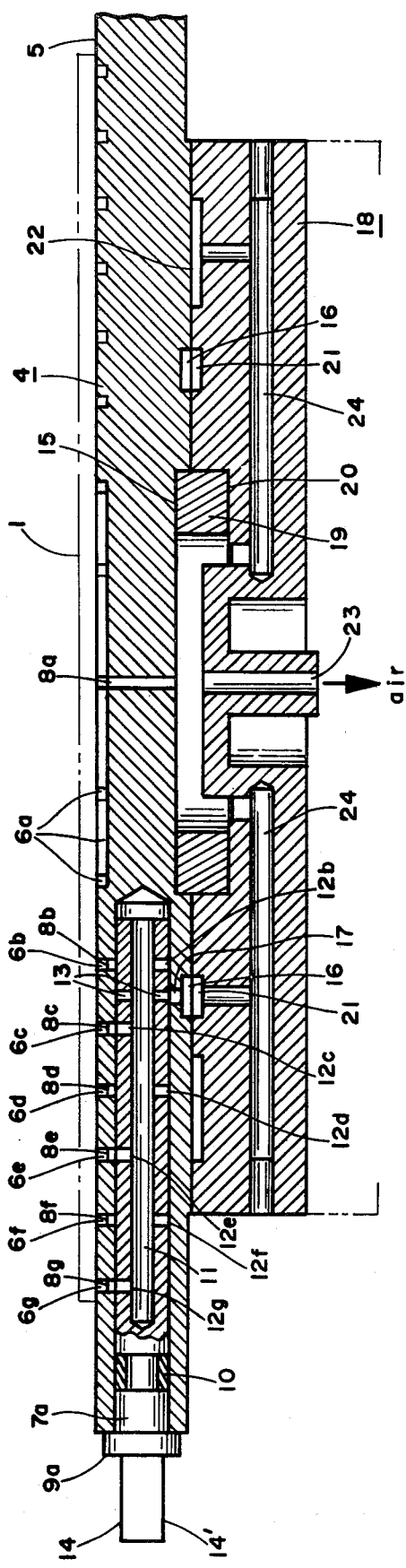
FIG. 3
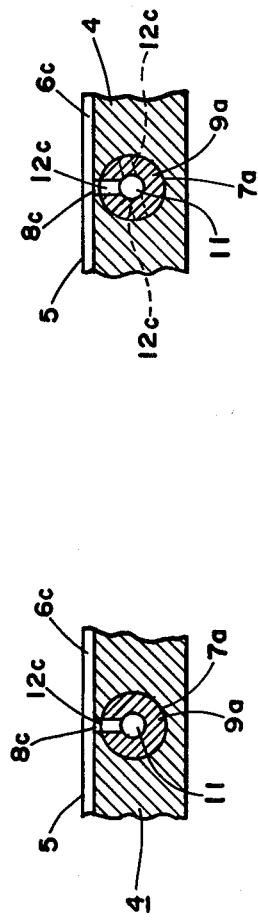
FIG. 6
FIG. 7

APPARATUS FOR HOLDING WORKPIECE BY SUCTION

BACKGROUND OF THE INVENTION

This invention relates to work holding apparatus and more particularly to such devices used for fastening of a workpiece on a table by suction.

When wafers or similar materials require precision processing or measurement, they are usually fixed on a table by suction. For handling wafers of different diameters, several alternative methods have been developed, namely, the use of a table matching the wafer in size, switching of air grooves by the use of screws or rotatable discs, and similar techniques.

If the table is to be changed according to the size of the material, a number of tables are needed, and the costs could be very high because they have to be of high precision. Moreover, the change of tables is a time-consuming operation often resulting in the loss of accuracy.

In the methods using screws to change air grooves, a number of air grooves are provided on the table with bi-directional or tri-directional vent screws installed at the crossing of air grooves. By turning the screws air flow is controlled to enable the securing of materials of different sizes. This method eliminates the requirement of a number of tables, but has other drawbacks, namely, difficulty in adjusting the screws and in ascertaining the direction of the vent, the susceptibility of vent clogging with equipment such as cutting machines, and considerable difficulty in leveling screw tops with the table top.

With the methods using double discs, disadvantages are: difficulty in aligning the holes of the top and bottom discs, in both manufacturing and operation; a tendency to clog; difficulty in removing cloggings; and difficulty in eliminating errors caused by the rotational slide of the top and bottom discs.

The present invention is directed toward a work holding device free from these disadvantages.

OBJECT AND SUMMARY OF THE INVENTION

An object of this invention is the provision of apparatus for holding by suction wafers and the like having different diameters by expanding or contracting the diameter of the suction area simply and quickly without replacing parts.

This and other objects of the invention are achieved with a table having a set of separate air grooves which are connected to the sleeve-fitting bores through connecting holes, the sleeves being provided with switching holes that couple the air grooves and the air pump or vacuum source.

BRIEF DESCRIPTION OF THE DRAWINGS

FIG. 3 is an enlarged section taken on line 3—3 of FIG. 2.

FIGS. 6 and 7 are transverse sections of modified forms of sleeves.

DESCRIPTION OF PREFERRED EMBODIMENTS

Figure 1:
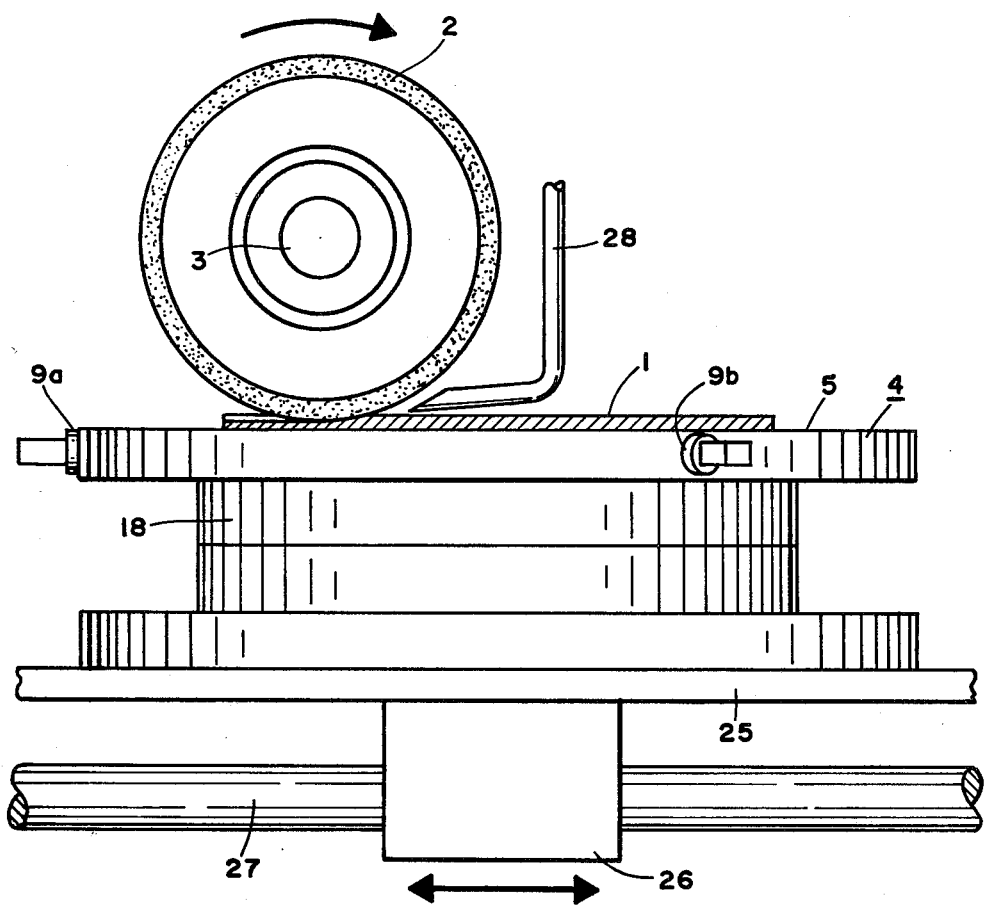
FIG. 1 is an elevation of cutting apparatus useful for dicing or scribing a silicon wafer and embodying this invention.

An example of an embodiment of this invention is the cutting system shown in FIG. 1 in which a silicon wafer 1 is diced or scribed by a diamond wheel 2 with high precision. The blade of wheel 2 preferably is made mainly of diamond particles having a thickness of 20 to 30 $\mu$m and rotates around spindle 3 in the direction of the arrow at a speed of several thousand rpm. The work 1, such as a silicon wafer, has a large number of printed integrated circuits (ICs) or large scale integrated circuits (LSIs) on the top surface with a 40 to 50 $\mu$m space in between for separation by wheel blade 2. Wafer 1 is usually a thin disce with standard diameters of 2, 2.5, 3 and 4". The present example presupposes seven diameters: 2, 2.5, 3, 3.5, 4, 4.5 and 5". The invention is not limited to these dimensions.

Table 4 has a diameter large enough to hold a wafer of the maximum size, e.g. 5". The top surface is ground flat, and is provided with concentrically formed circular shallow air channels or grooves 6a... 6g. Of these, air groove 6a, i.e., the two inside circular grooves and crossings, are for 2" wafers, the next groove 6b is for 2.5" wafers, and similarly, 6c for 3", 6d for 3.5", 6e for 4", 6f for 4.5" and 6g for 5".

Figure 2:
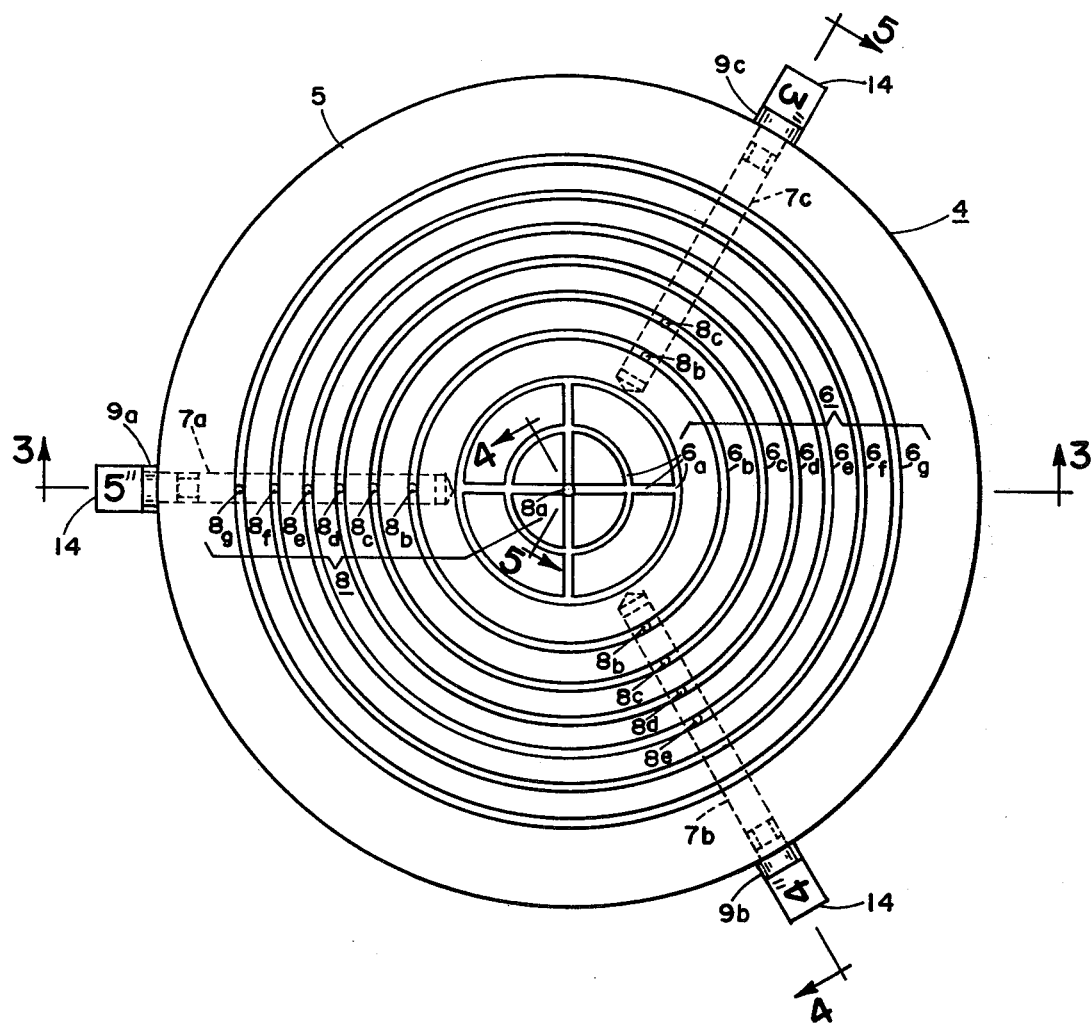
FIG. 2 is a plan view of the apparatus of FIG. 1.

Table 4 has a plurality (three as shown) bores 7a, 7b and 7c, see FIG. 2, extending radially from the periphery at a predetermined angular spacing, e.g. 120°. At the center of air groove 6a is a hole 8a extending entirely through table 4. Air grooves 6b and 6c for 2.5" and 3" wafers, respectively, are provided with respective holes 8b and 8c connecting to the three bores 7a, 7b, 7c. Similarly, air grooves 6d and 6e for 3.5" and 4" wafers, respectively, have holes 8d and 8e connected to the two bores 7a and 7b, respectively, and air grooves 6f and 6g for 4.5" and 5" wafers, respectively, are provided with holes 8f and 8g connected to one bore 7a.

Figure 4:
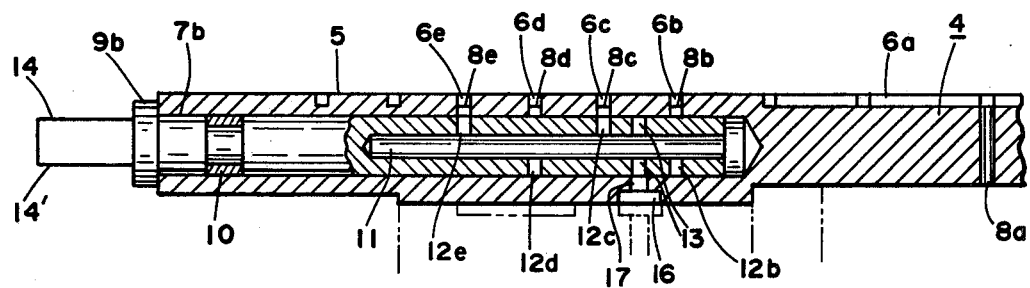
FIG. 4 is a section taken on line 4—4 of FIG. 2.
Figure 5:
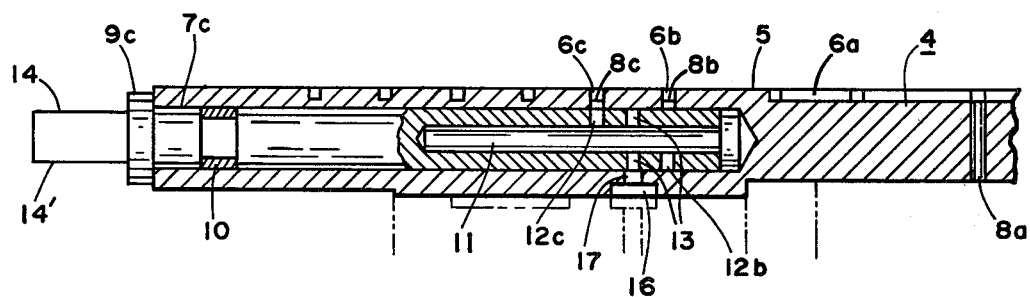
FIG. 5 is a section taken on line 5—5 of FIG. 2.

In order to control the flow of air, sleeves 9a, 9b and 9c are fitted air tight into bores 7a, 7b and 7c, respectively, with an O ring 10, and are freely rotatable. Sleeve 9a, see FIG. 3, is for switching 5" and 4.5" wafers, sleeve 9b, FIG. 4, is for switching 4" and 3.5" wafers and sleeve 9c, FIG. 5, is for switching 3" and 2.5" wafers. Each of these three sleeves has an internal bore or passage 11, a set of radial switching openings 12b... 12f drilled at right angles to the internal bore and at 180° each other, and an air hole 13. The outside end of each sleeve is shaped flat at top 14 and bottom 14' to serve as a knob and indicator.

The bottom of the table 4 has a central coupling recess 15, see FIG. 3, and a connecting recess 16 outside recess 15. These connecting recesses communicate with bores 7a, 7b and 7c through holes 17.

Support 18, see FIG. 1, is a stand on which the table 4 is mounted and has a recess 20 with the same diameter as the recess 15 and is disposed oppositely thereof. A guide ring 19 is fitted into the recesses 15 and 20 as shown. In addition, support 18 has a connecting recess 21 disposed oppositely of recess 16, and a table suction recess 22, both recesses 21 and 22 being outside recess 20. At the center of support 18 is an air passage 23 leading to a vacuum source such as an air pump (not shown). Air passage 23 is directly connected to hole 8a as well as to the connecting recess 21 and the table suction recess 22 through the connecting duct 24.

Support 18 is mounted on the plate 25 (FIG. 1) with bearings 26 underneath, so that it may slide on the rail 27. Close to the cutting edge of the wheel blade, a pipe 28 is provided to supply coolant to remove heat and dust.

The operation is as follows: Assume, as shown in FIGS. 1 and 3 that a 5" wafer 1 is to be held on the table. First, wafer 1 is placed on table 4 so as to cover the groove 6g. Sleeve 9a is then turned until indicator 14 shows 5" facing upwardly. The two other sleeves may be positioned in any direction without effect. When the air system is actuated, table 4 is fastened to support 18 as the air in the table suction recess 22 is drawn through connecting duct 24 and passage 23 in support 18. At the same time, air in groove 6a for 2" wafers is pulled through center hole 8a, and similarly, the air in grooves 6c, 6e and 6g for 5, 4 and 3" wafers, respectively, is drawn through connecting duct 24, recesses 21 and 16, hole 17, openings 13, passage 11, switching openings 12c, 12e and 12g, and connecting holes 8c, 8e and 8g. Thus the silicon wafer is firmly secured to the table by suction. The air may also be sucked through grooves 6b and 6d if the sleeves 9b and 9c are rotated into proper position. Table 4 together with the wafer 1 is now ready for left or right shifting on the rail 27 for cutting by the wheel blade 2.

When a 4.5" wafer is to be fixed on the table, sleeve 9a is turned 180° with the indicator 14 showing 4.5" facing upwardly. Air groove 6g for 5" wafers is now closed by the sleeve 9a.

When a wafer of less than 4" diameter is to be held on the table, sleeve 9a is turned 90° with the indicators (14) (14') facing sideways so that connecting holes 8b – 8g, inclusive, of sleeve 9a are all closed. The other sleeves 9b and 9c are turned similarly so as to adjust to the size of the wafer.

In the above example, switching openings 12b, 12d and 12f are positioned at 180° from openings 12c, 12e and 12g so that all may be closed when the sleeve is turned 90°. However, as shown in FIG. 6, the switching openings may be provided in only one direction, so that they may be closed in any other position. In this case, it is necessary to have the same number of sleeves as types of wafers. Also as shown in FIG. 7, switching openings 12 may be provided at 90° angular displacements.

In the above example, each sleeve-fitting bore is round so that the sleeve may be turned, but these parts may also be polygonally shaped so that the angular position of the sleeve may be changed by disengaging it from one position in the bore and engaging it into another.

The air grooves such as 6c may be rectangular or of any other cross-sectional shape except concentric circles.

As described above, this device permits holding of workpieces of different diameters with a single table 4, thus saving the cost of having a number of tables and the attendant loss of accuracy. The simplified switching operation, either turning or engagement/disengagement of the sleeves, ensures easy and unerring switching, minimal clogging, high precision and simple operation.

What is claimed is:

1. Apparatus for holding a workpiece by suction comprising
    a table top having an upper surface and a plurality of separate grooves in said surface,
    said table top having at least one radial bore extending under said grooves,
    said bore being interconnected with at least some of said grooves by holes, respectively, to provide pneumatic communication therebetween,
    a sleeve in said bore, said sleeve having a central axially extending passage therethrough, the position of said sleeve relative to said bore being independently changeable,
    said sleeve having a plurality of openings axially alignable with said holes in said bore whereby pneumatic communication between certain grooves and the sleeve passage is established,
    the axial locations of certain of said openings in the respective sleeves being different, and
    a source of vacuum connectable to said passage of said sleeve,
    the number of said grooves subject to suction being changeable through selective change of the position of said sleeve relation to said bore.

2. Apparatus according to claim 1 with a plurality of said radial bores containing sleeves, respectively, the numbers of openings in the respective sleeves being different.

3. Apparatus according to claim 2 in which said grooves are concentric.

4. Apparatus according to claim 2 in which said bores and said sleeves are cylindrically shaped, each of said sleeves being rotatable about its axis whereby to control pneumatic communication between said vacuum source and said grooves.

5. Apparatus according to claim 2 in which the outer portion of each sleeve projects from the perifery of said table and has indicator markings thereon, said markings indicating the grooves under suction due to the position of the sleeve in the associated bore.

6. Apparatus according to claim 2 in which said sleeves extend the full length of said bores, respectively.

7. Apparatus according to claim 4 in which the openings in each sleeve extend radially between the passage and the exterior of the sleeve, the connection and disconnection of said passage and said holes through said openings being effected by change of the angular displacement of said sleeve relative to said bore.

8. Apparatus according to claim 2 in which certain of said grooves are permanently pneumatically interconnected to said vacuum source independently of said bores.

* * * * *